(12) United States Patent
Demharter et al.

(10) Patent No.: US 10,197,644 B2
(45) Date of Patent: Feb. 5, 2019

(54) LOCAL TRANSMIT COIL WITH INTEGRATED SAFETY DEVICE

(71) Applicants: Nikolaus Demharter, Dormitz (DE); Markus Vester, Nürnberg (DE); Volker Weißenberger, Möhrendorf (DE)

(72) Inventors: Nikolaus Demharter, Dormitz (DE); Markus Vester, Nürnberg (DE); Volker Weißenberger, Möhrendorf (DE)

(73) Assignee: Siemens Healthcare GmbH, Erlangen (DE)

( * ) Notice: Subject to any disclaimer, the term of this patent is extended or adjusted under 35 U.S.C. 154(b) by 180 days.

(21) Appl. No.: 15/266,042

(22) Filed: Sep. 15, 2016

(65) Prior Publication Data
US 2017/0074953 A1 Mar. 16, 2017

(30) Foreign Application Priority Data
Sep. 16, 2015 (DE) .......... 10 2015 217 723

(51) Int. Cl.
| | | |
|---|---|---|
| *G01V 3/00* | (2006.01) | |
| *G01R 33/341* | (2006.01) | |
| *G01R 31/06* | (2006.01) | |
| *G01R 33/36* | (2006.01) | |
| G01R 33/28 | (2006.01) | |
| G01R 33/34 | (2006.01) | |

(52) U.S. Cl.
CPC .......... *G01R 33/341* (2013.01); *G01R 31/06* (2013.01); *G01R 33/36* (2013.01); *G01R 33/288* (2013.01); *G01R 33/34046* (2013.01); *G01R 33/34076* (2013.01); *G01R 33/3692* (2013.01)

(58) Field of Classification Search
USPC ......................................... 324/322
See application file for complete search history.

(56) References Cited

U.S. PATENT DOCUMENTS

| | | | |
|---|---|---|---|
| 2010/0013461 A1* | 1/2010 | Masubuchi | .......... G01R 33/288 324/201 |
| 2011/0221441 A1 | 9/2011 | Baumgartl et al. | |
| 2013/0147479 A1 | 6/2013 | Bielmeier et al. | |
| 2014/0015547 A1* | 1/2014 | Bottomley | ............. G01R 21/00 324/647 |
| 2016/0077173 A1* | 3/2016 | Juloski | ............... G01R 33/3852 324/307 |

FOREIGN PATENT DOCUMENTS

| | | |
|---|---|---|
| DE | 102010010820 A1 | 9/2011 |
| DE | 102011081915 A1 | 6/2013 |

OTHER PUBLICATIONS

German office Action for related German Application No. 10 2015 217 723.8 dated Aug. 10, 2016, with English Translation.

* cited by examiner

*Primary Examiner* — Rodney E Fuller
(74) *Attorney, Agent, or Firm* — Lempia Summerfield Katz LLC

(57) ABSTRACT

A local transmit coil for a magnetic resonance tomograph is provided. The local transmit coil includes a signal transmission device for signal transmission to the magnetic resonance tomograph, and a transmission antenna for generating a magnetic excitation field. The local transmit coil further includes an evaluation device for monitoring a function of the local transmit coil. The evaluation device is configured to transmit a status signal relating to the local transmit coil via the signal transmission device.

15 Claims, 2 Drawing Sheets

LOCAL TRANSMIT COIL WITH INTEGRATED SAFETY DEVICE

CROSS-REFERENCE TO RELATED APPLICATIONS

This application claims the benefit of DE 10 2015 217 723.8, filed on Sep. 16, 2015, which is hereby incorporated by reference in its entirety.

TECHNICAL FIELD

Embodiments relate to a local transmit coil for a magnetic resonance tomograph.

BACKGROUND

Magnetic resonance tomographs are imaging devices that, in order to represent an examination object, align nuclear spins of the examination object with a strong external magnetic field. The tomograph excites an alternating magnetic field for precession around the alignment. The precession or return of the spins from the excited state to a state with lower energy generates an alternating magnetic field. The alternating magnetic field is received via antennas.

With the aid of magnetic gradient fields, a spatial encoding is imprinted on the signals. The spatial encoding subsequently allows the received signal to be assigned to a volume element. The received signal is then evaluated and a three-dimensional imaging view of the examination object is provided.

The alternating magnetic field for excitation is dependent in its frequency on the static field used for alignment. The characteristic frequency is referred to as the Larmor frequency and has a value of 42.58 MHz/Tesla. As the intensity of the magnetic field increases, the frequency of the alternating fields therefore likewise increases.

Also associated with the higher frequency is an increased absorption in human tissue referred to as the SAR (specific absorption rate). For wearers of implants such as cardiac pacemakers, compliance with threshold values is of vital importance. For this reason, the standard IEC60601-2-33 provides a separate safe mode of operation for magnetic resonance tomographs, referred to as the "Fixed Parameter Option" (FPO). The FPO prescribes a limitation of operating parameters for the gradient and excitation fields of the magnetic resonance tomograph for the safe mode of operation.

In the safe mode of operation only head coils are permissible as local transmit coils. However, present day SAR-monitoring devices are not equipped to monitor the highly restricted threshold values for the FPO mode in conjunction with local coils.

The problem therefore arises of making the operation of a magnetic resonance tomograph safer.

SUMMARY AND DESCRIPTION

The scope of the present invention is defined solely by the appended claims and is not affected to any degree by the statements within this summary. The present embodiments may obviate one or more of the drawbacks or limitations in the related art.

The local transmit coil according to an embodiment for a magnetic resonance tomograph includes a signal transmission device for signal transmission to the magnetic resonance tomograph. The signal transmission device may be, for example, a cable connection, optical or electrical, or a wireless signal connection using WLAN, Bluetooth, or other wireless technology.

The local transmit coil according to an embodiment includes a transmitting antenna for generating a magnetic excitation field for image acquisition, also known as a B1 field. The transmitting antenna may be a coil winding for example, or a bird cage antenna.

The local coil according to an embodiment includes an evaluation device that monitors a function of the local transmit coil. A potential malfunction of the local coil may be detected by the evaluation device. The evaluation device is further configured to transmit the status that has been determined via the signal transmission device using a status signal. The local transmit coil also includes a housing, in which all or at least some of the aforementioned components are arranged.

The local transmit coil may include receiving antennas or be configured to acquire high frequency signals for magnetic resonance imaging using the transmission antennas.

The local transmit coil including the evaluation device provide that a function of the local transmit coil is operational and transmits the information or conversely, signals a malfunction.

The magnetic resonance tomograph according to an embodiment is provided for use with a local transmit coil. The magnetic resonance tomograph includes a receiving device for receiving a status signal from the local transmit coil. The receiving device complements the corresponding signal transmission device in the local coil, so that the receiving device may receive signals from the signal transmission device. Furthermore, the magnetic resonance tomograph includes a control for controlling an image acquisition of the magnetic resonance tomograph.

The control is configured to operate the magnetic resonance tomograph in a safe image acquisition mode that does not exceed the predetermined values for the magnetic excitation field. The operation may involve, for example, a "Fixed Parameter Option" style of operation. The control of the magnetic resonance tomograph according to an embodiment is also configured to enable the safe image acquisition mode as a function of a predetermined status signal received by the local transmit coil. The control is configured to actively interrupt an image acquisition. The control does not carry out the interruption if a first predetermined status of the local coil is received, or conversely, if a second predetermined status is not received.

The magnetic resonance tomograph may be configured so that the "Fixed Parameter Option" is complied with for an image acquisition with a local coil and aborted if necessary.

In an embodiment of the local transmit coil, the evaluation device is configured to determine a malfunction and to transmit a status signal relating to the malfunction.

The evaluation device determines if a malfunction of the local transmit coil is occurring and if measures are being taken to safety provide for the patient.

In an embodiment, the local transmit coil includes a magnetic field sensor for detecting the magnetic excitation field. The magnetic field sensor may include, for example, one or a plurality of receiving coils, a Hall effect sensor or other elements sensitive to high frequency alternating magnetic fields. The evaluation device is in signal connection with the magnetic field sensor. The evaluation device includes, for example, one or a plurality of signal inputs for the magnetic field sensor and/or other sensor inputs for monitoring whether for example, a housing of the local transmit coil is closed or open. The evaluation device is configured to evaluate the signals at the signal inputs and to ascertain a status of the local transmit coil, e.g. whether the operating parameters, determined via the sensor inputs fall within a predetermined range.

By detecting the magnetic field in direct vicinity of the transmit coil, the local transmit coil provides that the magnetic field falls within the predetermined limits. The close vicinity of the sensor also allows the necessary accuracy to adhere to stricter threshold values imposed by the FPO mode of operation.

In an embodiment, the local transmit coil is configured to determine a malfunction from a value derived from the magnetic field that exceeds a predetermined threshold value.

The local transmit coil may detect and signal a local exceeding of a threshold value for a magnetic excitation field.

In an embodiment, the local transmit coil is designed to determine a malfunction of the magnetic field sensor and/or of the evaluation device as a malfunction.

The local transmit coil may detect that the monitoring unit is currently not in a position to monitor the magnetic field correctly.

In an embodiment of the local coil, the signal transmission device has a plug connection and the status signal is transmitted via a plug contact in the plug connection. A bridge in the plug and/or an electrical potential signaling the presence of the local coil may be provided on a predetermined contact in the plug. For example, a predefined positive or negative voltage signals the presence of the local coil and compliance with the predetermined threshold values.

A plug connection is a simple and cheap option for transmitting a signal. On a head coil, a plug connection and a cable that provides the transmitting antenna with a signal and power are often already available.

In an embodiment of the magnetic resonance tomograph, the receiving device is a plug connection. The plug connection may be, for example, a plug or a socket for an electrical or optical cable. The magnetic resonance tomograph is configured to receive the status signal via a contact in the plug connection.

A plug connection is a simple and cheap option for transmitting a signal. Because the magnetic resonance tomograph is configured to receive the signal via a plug contact, imaging may be interrupted or prevented by the control even in the absence of the signal if there is no signal present. For example, if the local transmit coil is not or is not correctly plugged in or has a fault.

In an embodiment of the magnetic resonance tomograph, the receiving device is configured to receive only the status signal via the contact in the socket. The contact is not used to transmit other signals. The presence of the FPO compatible local transmit coil may be signaled via the contact at the same time as the correct function thereof in the context of the threshold values permitted. The contact may be reserved for FPO compatible local transmit coils.

Other transmit coils may be identified as FPO compatible transmit coils by the magnetic resonance tomograph even when the signal is due to a malfunction. A transmission operation with an incorrect local transmit coil that might lead to the exceeding of threshold values is recorded.

The aforementioned properties, features and advantages of the present invention, together with the manner in which they are achieved, will emerge more clearly and comprehensibly in conjunction with the following description of the embodiments that are described in greater detail with reference to the drawings.

BRIEF DESCIPTION OF THE DRAWINGS

DETAILED DESCRIPTION

Figure 1:
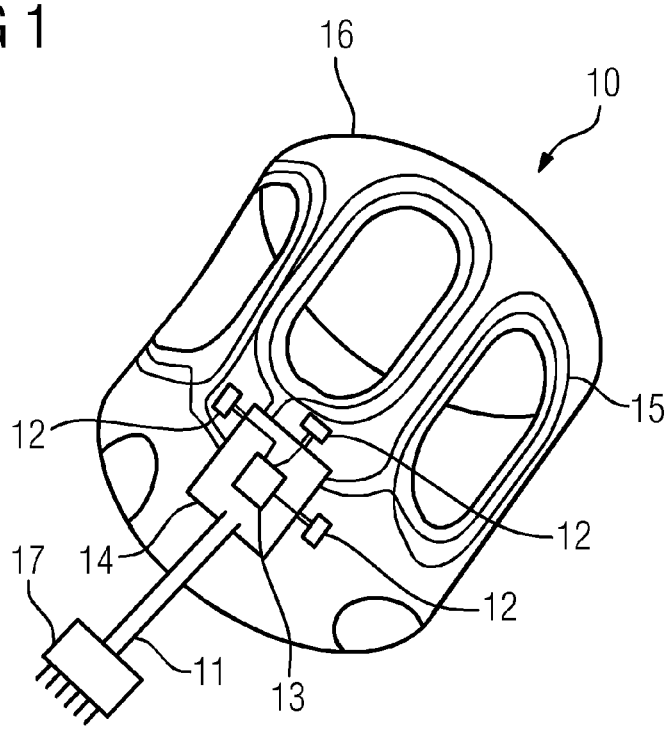
FIG. 1 depicts a diagrammatic view of a local transmit coil according to an embodiment.

FIG. 1 depicts a diagrammatic view of a local coil 10 according to an embodiment. The local coil is depicted as a head coil. In FIG. 1, for greater clarity, the local transmit coil 10 is shown without an outer shell of a housing 16, such that the internal components are visible.

The local transmit coil 10 includes a housing 16, in which coil windings are arranged as transmitting antennas 15 for generating an alternating magnetic field. Depending on the type of local coil, there may be one or a plurality of coil windings.

The transmitting antennas 15 are electrically connected to a power supply module 14. The power supply module 14 provides distribution of one or a plurality of transmission signals that are supplied to the local coil via electric cables. These electric cables may be part of the signal transmission device 11. At the end of the cable, a plug 17 is provided to create an electrical connection with a magnetic resonance tomograph 20.

The local transmit coil 10 further includes one or a plurality of magnetic field sensors 12. The magnetic field sensors 12 are arranged such that each magnetic field sensor may representatively detect a magnetic field relating to at least one transmitting antenna 15. Representatively denotes that a magnetic field sensor supplies a signal that may be evaluated by an evaluation device for magnetic fields. The intensity of the magnetic fields is in the range of the threshold values to be monitored if the coil winding is controlled accordingly. The orientation of the magnetic field sensors 12 is aligned with the magnetic field lines of the transmitting antennas 15 such that the magnetic field sensors 12 supply a signal. If the magnetic field sensors 12 are designed as coils, for example, then the surface normal thereof is not vertical, but rather, for example, parallel to the magnetic field lines. The sensors may be Hall sensors, sensors based on quantum mechanics effects (GMR sensors), or other sensors that are suitable for capturing magnetic fields in the range of the threshold values that are to be monitored.

The local transmit coil 10 includes an evaluation device 13. The evaluation device 13 is in a signal connection with the magnetic field sensor and/or sensors 12, such that the evaluation device 13 may receive a signal that is dependent on the intensity of the magnetic excitation fields detected by the magnetic field sensors 12. However, the evaluation device 13 may additionally or only be in a signal connection with other sensors that monitor an application (e.g., appropriate function of the local transmit coil 10). Other sensors may include, for example, a contact switch that monitors whether the housing of a head coil is properly sealed or a voltage sensor that monitors a setting of the head coil, such as a status of a PIN diode for detuning.

The evaluation device 13 is configured to derive, from the signal and/or signals that have been detected by a magnetic field sensor 12, by a plurality of magnetic field sensors 12, and/or further sensors, a status for the local transmit coil 10. The evaluation device 13 is further configured to transmit the status as a status signal to the signal transmission device 11.

For example, the evaluation device 13 is configured to transmit a status "local transmit coil working in an application-appropriate manner" as a status signal, as long as all the magnetic field sensors 12 detect a magnetic field intensity that is below the predetermined threshold values. As soon as one of the magnetic field values exceeds a threshold value, a different status signal is transmitted or no further status signal is transmitted. A different or no status signal is transmitted if, for example, a control voltage monitored by the evaluation device 13 assumes values that are not permitted. The evaluation device 13 monitors both a failure of individual components and also a total failure such as a cable break or failure of the supply voltage.

The evaluation device 13 may be arranged on the power supply module 14 or separately in the housing 16 of the local transmit coil.

In the embodiment depicted in FIG. 1, a status signal transmitted by the signal transmission device 11 may also be a short circuit between two contacts in a plug 17. The short circuit may signal to a connected magnetic resonance tomograph of a presence of a short circuit of the local coil. The short circuit may be generated by an active switch in the local transmit coil 10, such that a total failure of the local transmit coil (e.g., the absence of a supply voltage) may be detected. Instead of the active short circuit, other predetermined non-zero or non-ground potentials may be used.

In an embodiment, a contact in the plug 17 is reserved for a type of local transmit coil alone, for instance for FPO compatible local transmit coils. The coil is not erroneously detected as an FPO compatible transmit coil even where there is a malfunction of a transmit coil of a different type and threshold values for FPO operation are not incorrectly exceeded by this different transmit coil.

Figure 2:
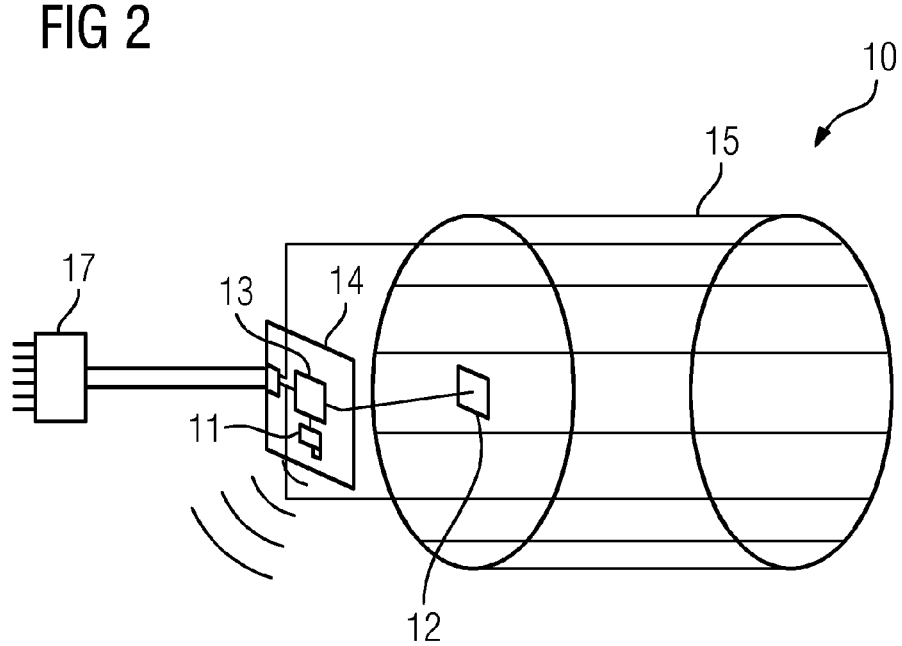
FIG. 2 depicts a diagrammatic view of a local transmit coil according to an embodiment.

FIG. 2 depicts a different embodiment of a local coil 10 in diagram form. Similar elements are denoted by the same reference signs. In FIG. 2, the housing 15 is blanked out to give a clearer picture.

The transmitting antenna 15 is depicted in FIG. 2 as a bird-cage antenna. The signal transmission device 11 is not configured as a cable, but as a wireless transmission unit. The signal transmission device in FIG. 2 may use a wireless standard such as Bluetooth, WLAN, or other standardized or proprietary wireless transmission technology and protocols. The transmission technology used may be real-time capable.

In a wireless transfer of the status signal, the transfer may be repeated within predetermined time intervals. The time periods and the evaluation thereof are illustrated in FIG. 3 in connection with the magnetic resonance tomograph 100.

Figure 3:
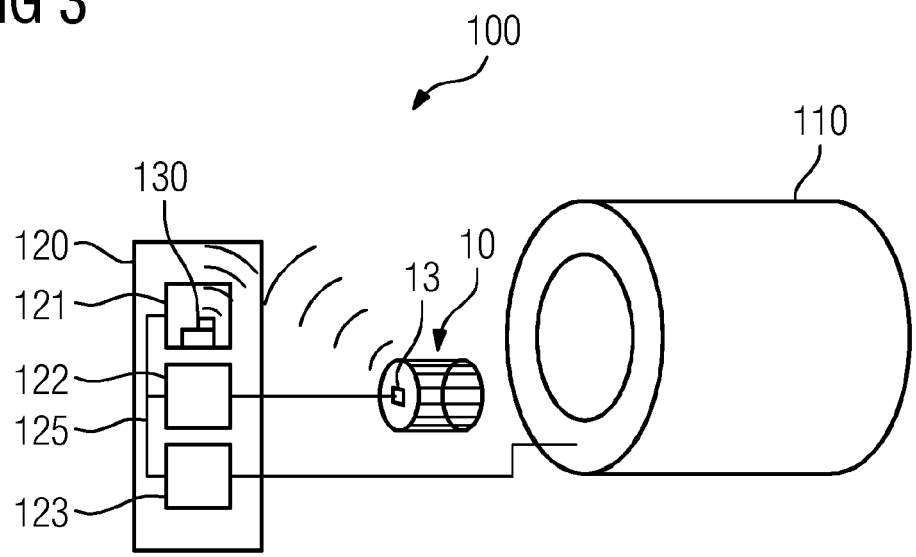
FIG. 3 depicts a diagrammatic view of a magnetic resonance tomograph and a local transmit coil according to an embodiment.

FIG. 3 depicts in diagram form a magnetic resonance tomograph 100 with a local transmit coil 10. Similar elements are denoted by the same reference signs.

The magnetic resonance tomograph in FIG. 3 includes a magnetic field unit 110 that includes a magnet (not shown) for generating a static B0 field and gradient coils (not shown) for generating gradient fields.

The magnetic resonance tomograph 100 further includes a control 120 with a control unit 121, a high frequency control 122, and a gradient control 123 that controls the magnetic field unit 110. The individual controls 121, 122, and 123 are in signal exchange with one another via a signal connection 125.

The magnetic resonance tomograph 100 further includes a receiving unit 130 that is in signal connection with the control 120. For example, the receiving device 130 may be part of the control unit 121. The receiving device 130 is configured to receive signals from the signal transmission device 11 of the local transmit coil 10 with a status signal and to further direct them to the control 120 or control unit 121.

The control 120 is configured to evaluate the status signal and to react accordingly to an image acquisition.

For example, the local transmit coil 10 transmits a status signal that signals an exceeding of a predetermined threshold value, such as an FPO threshold value, through a magnetic excitation field intensity that has been detected. The control 120 may be configured, for example, such that the control 120 interrupts an image acquisition. The control 120 may change the sequence and/or control parameters such that the threshold value is complied with.

The status signal may display a fault in a magnetic field sensor, in the evaluation device 13, or in the local transmit coil 10. The control may be configured, for example, such that the control interrupts an image acquisition.

In an FPO mode of operation, the control 120 may not receive a status signal from the local transmit coil 10. The control 120 may be configured such that the control 120 does not start any image acquisition without a status signal from the local coil 10 since a defect in or absence of the local coil is conceivable and therefore adequate monitoring of the threshold values is not possible. The control 120 may only start or continue an image acquisition in the FPO mode as long as one or a plurality of predetermined status signals are received at least within a predetermined time period. The time period may be, for example, a fraction of a duration of an excitation pulse, for example, one fifth or one tenth. A fraction of a sequence duration may be, for example, one fifth or one tenth or one hundredth. A fraction of a sequence duration may be used if the signal transmission between the local transmit coil 10 and the magnetic resonance tomograph 100 is done wirelessly.

Figure 4:
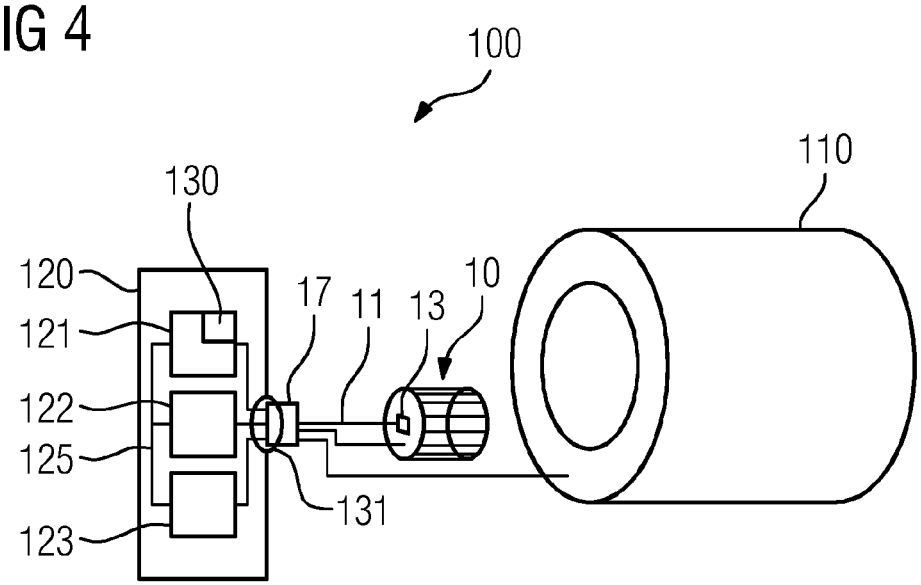
FIG. 4 depicts a diagrammatic view of a magnetic resonance tomograph and a local transmit coil according to an embodiment.

FIG. 4 depicts an embodiment of the magnetic resonance tomograph 100 and of a local transmit coil 10.

The embodiment shown in FIG. 4 includes a wired signal transmission device 11 and a wired receiving device 130 that are connectable via a cable.

In an embodiment, the signal transmission device 11 of the local transmit coil 10 includes a plug 17 with electrical contacts. On the control 120 of the magnetic resonance tomograph 100, an additional socket 131 is provided, which with the plug 17 creates an electrical connection via which the status signals are transmitted.

Other cables for a high frequency control 122 and the gradient control 123 may be combined in one cable.

The receiving device 130 of the control 120 may be configured to receive the potential on one or a plurality of contacts of the socket 131 as a status signal. The control 120 may then be configured for example, to display the presence of a predetermined potential or a short circuit or predetermined resistance as the status "presence of the local transmit coil" and to allow image acquisition in the FPO mode. The control 120 may display the absence of a predetermined potential or resistance as the status "local transmit coil is not functioning properly" and may abort an image acquisition in the FPO mode. The evaluation device 13 may also be configured to transmit an exceeding of the threshold value for the magnetic excitation field, to transmit a corresponding change in potential or change in resistance as a status signal, and to cause the control 120 to abort an image acquisition when the status signal is received.

More complex signals may be used as status signals.

The contacts for the status signal on the socket 131 or the plug 17 may be reserved exclusively for FPO compatible local transmit coils. The contacts cannot be occupied by other types of coil. In the event of a malfunction of a local transmit coil of a different type, if the occupation by another type of coil is ruled out on the socket 131, a properly functioning FPO compatible local transmit coil is not incorrectly detected, and an excitation signal is transmitted that exceeds the FPO threshold values with a non-compatible transmit coil, then the magnetic resonance tomograph 100 may also evaluate the status signal with a hardware circuit and rule out the exceeding of threshold values. Ruling out the exceeding of the threshold values facilitates a certification in the context of a protected mode of operation such as FPO.

Although the invention has been illustrated and described in greater detail with the preferred embodiments, the invention is not restricted to the examples disclosed, and other variants can be derived therefrom by a person skilled in the art, without going beyond the scope of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local transmit coil for a magnetic resonance tomograph, the local transmit coil comprising:
   a signal transmission device configured to transmit a signal to the magnetic resonance tomograph;
   a transmitting antenna configured to generate a magnetic excitation field;
   an evaluation device configured to monitor a function of the local transmit coil and to transmit a status signal from the local transmit coil via the signal transmission device; and
   a magnetic field sensor configured to detect the magnetic excitation field,
   wherein the evaluation device is in signal connection with the magnetic field sensor.

2. The local transmit coil of claim 1, wherein the evaluation device is further configured to detect a malfunction and to transmit the status signal, which relates to the malfunction.

3. The local transmit coil of claim 2, wherein the malfunction is an exceeding of a predetermined threshold value for a value derived from the magnetic excitation field.

4. The local transmit coil of claim 2, wherein the malfunction is a malfunction of the magnetic field sensor, the evaluation device, or the magnetic field sensor and the evaluation device.

5. The local transmit coil of claim 1, wherein the signal transmission device comprises:
   a plug, wherein the status signal is transmitted via a contact in the plug.

6. A magnetic resonance tomograph for use with a local transmit coil, the magnetic resonance tomograph comprising:
   a receiving device configured to receive a status signal from the local transmit coil; and
   a controller configured to control an image acquisition by the magnetic resonance tomograph,
   wherein the controller is configured to:
      operate the magnetic resonance tomograph in a safe image acquisition mode that does not exceed predetermined values for a magnetic excitation field; and
      enable running of the safe image acquisition mode as a function of a status signal received by the local transmit coil,
   wherein the local transmit coil comprises a magnetic field sensor configured to detect the magnetic excitation field, and
   wherein the magnetic field sensor is in signal connection with an evaluation device.

7. The magnetic resonance tomograph of claim 6, wherein the receiving device comprises a socket, and the magnetic resonance tomograph is configured to receive the status signal via a contact in the socket.

8. The magnetic resonance tomograph of claim 7, wherein the receiving device is configured to receive only the status signal via the contact in the socket.

9. The magnetic resonance tomograph of claim 6, wherein the
   evaluation device is configured to detect a malfunction and to transmit a status signal relating to the malfunction.

10. The magnetic resonance tomograph of claim 9, wherein the malfunction is an exceeding of a predetermined threshold value for a value derived from the magnetic excitation field.

11. The magnetic resonance tomograph of claim 9, wherein the malfunction is a malfunction of the magnetic field sensor, the evaluation device, or the magnetic field sensor and the evaluation device.

12. A system comprising:
   a local transmit coil comprising:
      a signal transmission device configured to transmit a signal to a magnetic resonance tomograph;
      a transmitting antenna configured to generate a magnetic excitation field;
      an evaluation device configured to monitor a function of the local transmit coil and to transmit a status signal from the local transmit coil via the signal transmission device; and
      a magnetic field sensor configured to detect the magnetic excitation field, wherein the evaluation device is in signal connection with the magnetic field sensor,
   a magnetic resonance tomograph comprising:
      a receiving device configured to receive the status signal from the local transmit coil; and
      a controller configured to:
         control an image acquisition of the magnetic resonance tomograph;

operate the magnetic resonance tomograph in a safe image acquisition mode that does not exceed predetermined values for the magnetic excitation field; and run the safe image acquisition mode as a function of a status signal received from the local transmit coil.

13. The system of claim 12, wherein the evaluation device is configured to detect a malfunction and to transmit a status signal relating to the malfunction.

14. The system of claim 13, wherein the malfunction is an exceeding of a predetermined threshold value for a value derived from the magnetic excitation field.

15. The system of claim 13, wherein the malfunction is a malfunction of the magnetic field sensor, the evaluation device, or the magnetic field sensor and the evaluation device.

\* \* \* \* \*